United States Patent [19]

Kim

[11] Patent Number: 5,801,656
[45] Date of Patent: Sep. 1, 1998

[54] DIGITAL-TO-ANALOG CONVERTER USING A CCD HAVING CHARGE SOURCE REGIONS CORRESPONDING TO DIGITAL DATA

[75] Inventor: Yong Gwan Kim, Kyungki-do, Rep. of Korea

[73] Assignee: LG Semicon Co., Ltd., Chungcheongbuk-do, Rep. of Korea

[21] Appl. No.: 466,206

[22] Filed: Jun. 6, 1995

[51] Int. Cl.$^6$ .................................................. H03M 1/66
[52] U.S. Cl. ................................................... 341/150
[58] Field of Search ..................................... 341/150, 144, 341/145, 126

[56] References Cited

U.S. PATENT DOCUMENTS

| | | | |
|---|---|---|---|
| 4,087,812 | 5/1978 | Terman | 340/347 |
| 4,099,175 | 7/1978 | Rubin | 340/347 |
| 4,115,766 | 9/1978 | Smith | 340/347 |
| 4,126,852 | 11/1978 | Baertsch | 340/347 |
| 4,321,584 | 3/1982 | McNutt | 340/347 |

*Primary Examiner*—Howard L. Williams
*Attorney, Agent, or Firm*—Finnegan, Henderson, Farabow, Garrett & Dunner, L.L.P.

[57] ABSTRACT

A D/A converter using a CCD for converting digital data to analog data, the CCD comprises a semiconductor having a first-conductivity type well. High-concentration charge source regions are positioned on predetermined portions of the semiconductor substrate in correspondence to the number of bits of the digital data. A plurality of barrier gates are formed on the charge source regions to respectively receive the bit signals of the digital data. Poly-gates are formed on the charge source regions having area that differ in correspondence to the bit signals of the digital data. A common output gate is formed on each of the poly-gates, and a high-concentration, second-conductivity type, floating diffusion area is formed on the output gate to collect charges accumulated in the poly-gates and to sense an overall amount of the charges. A reset gate and reset drain area are formed on the floating diffusion area for discharging the accumulated charges after the floating diffusion area senses the overall amount of the accumulated charges that corresponds to the analog data.

2 Claims, 3 Drawing Sheets

DIGITAL-TO-ANALOG CONVERTER USING A CCD HAVING CHARGE SOURCE REGIONS CORRESPONDING TO DIGITAL DATA

BACKGROUND OF THE INVENTION

1. Field of the Invention

The present invention relates to a digital-to-analog (D/A) converter, and more particularly, to a D/A converter using a charge-coupled device (CCD).

2. Description of Related Art

FIG. 1 is a circuit diagram of a conventional D/A converter. The circuit includes several electronic switches $S_0$–$S_{N-1}$ which are connected to a voltage source $-V_R$ and to ground. The outputs of switches $S_0$–$S_{N-1}$ are respectively coupled to N resistors R of different resistances. The switches represent bits, with $S_0$ representing the least significant bit (LSB) and $S_{N-1}$ representing the most significant bit (MSB). Resistors R, coupled to the switches $S_0$ to $S_{N-2}$, have resistances $2^{N-1}$ R. The resistor R coupled to the output of electron switch $S_{N-1}$ has a resistance R.

An amplifier OP1 sums the output voltages of electronic switches $S_0$–$S_{n-1}$ applied through the N resistors and amplifies the result by a predetermined gain.

When a digital HIGH signal 1 is applied to a conventional D/A converter, electron switches $S_0$–$S_{N-1}$ select and output the source voltage $(-V_R)$. When a LOW signal 1 is applied, the switches select and output the ground voltage.

When a HIGH signal 1 is applied to electron switch $S_{N-1}$ (MSB), and a LOW signal 0 is applied to the other switches, electron switch $S_{N-1}$ is coupled to the voltage source $-V_R$ and the other switches are grounded. The current through resistor R coupled to the output of electronic switch $S_{N-1}$ is $-V_R/R$. The voltage of the final output $V_0$ is $(-V_R/R) * R'$.

In another example, if five bits, starting with the MSB of electronic switch $S_{N-1}$, are HIGH (1) and the remaining bits are LOW (0), the current of output $V_o$ is $(-V_R/R) * R'+(-V_R/2R) * R'+(-V_R/4R) * R'+(-V_R/8R) * R'+(-V_R/16R) * R'=(16+8+4+2+1)[(-V_R/16R) * R']=31(-V_R/16R) * R'$.

However, the conventional D/A converter has several drawbacks. The likelihood of inaccurate D/A conversion increases as the number of bits increase, and the resistances become greater by the factor to $2^N$. Further, if the minimum resistance is too small, there is a risk of inaccuracies. However, if the minimum resistance is too large, the maximum resistance becomes extraordinarily large.

SUMMARY OF THE INVENTION

Therefore, it is an object of the present invention to provide an efficient and reliable D/A converter structure using a CCD Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the digital-to-analog (D/A) converter for converting digital data to analog data of the present invention utilizes a CCD that comprises a semiconductor substrate having a first-conductivity type well. High-concentration charge source regions are positioned on predetermined portions of the semiconductor substrate and correspond to a number of bits of the digital data. A plurality of barrier gates are formed on the charge source regions and receive as inputs of corresponding bit signals of the digital data. Poly-gates are formed on the charge source regions and having areas that correspond to the bit signals of the digital data. A common output gate is formed on each of the poly-gates. A high-concentration, second-conductivity-type, floating diffusion area is formed on the output gate to collect charges accumulated in the poly-gates to sense an overall amount of the charges. A reset gate and reset drain area are formed on the floating diffusion area to discharge the accumulated charges after the floating diffusion area senses the overall amount of the charges that correspond to the analog data.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

DETAILED DESCRIPTION OF THE PREFERRED EMBODIMENTS

Figure 1:
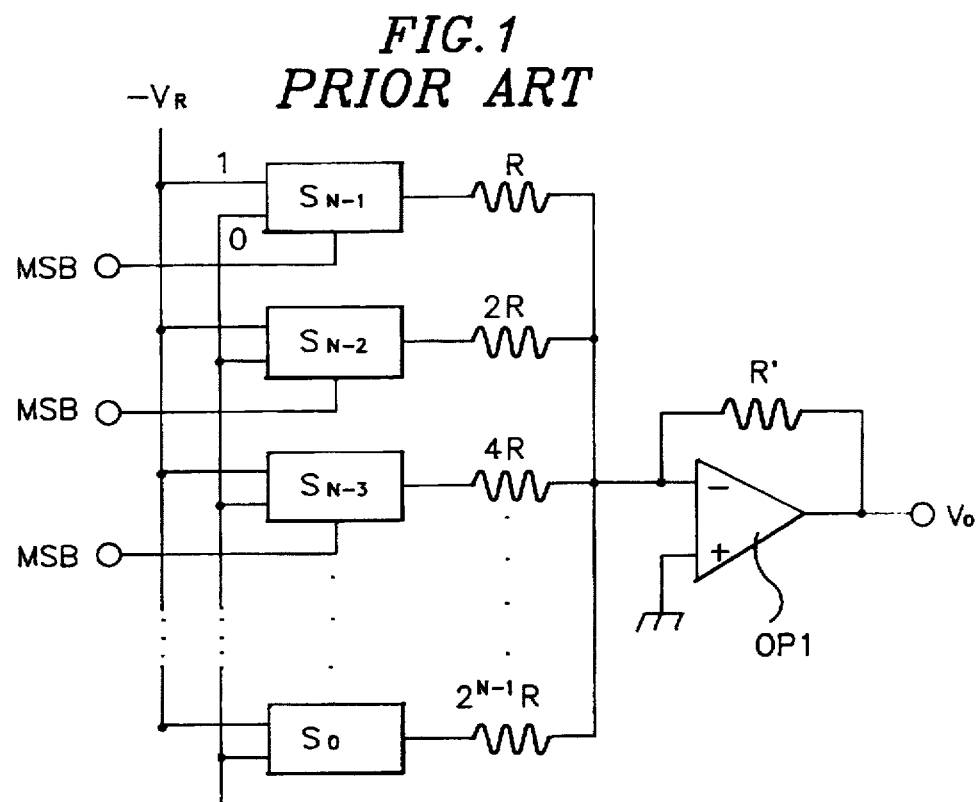
FIG. 1 is a circuit diagram of a conventional D/A converter.
Figure 2:
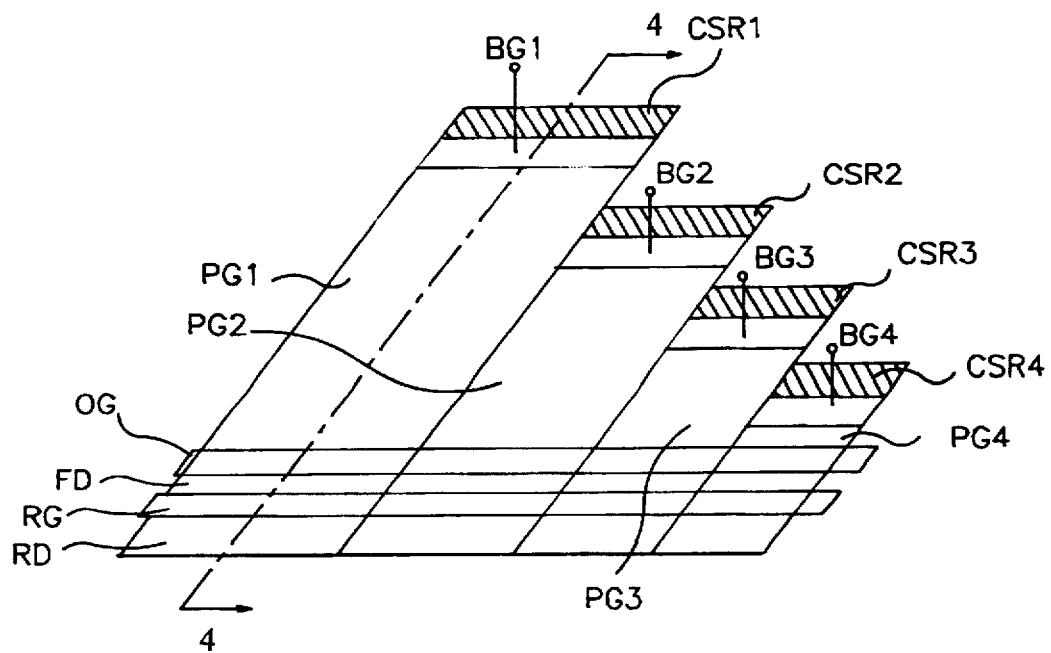
FIG. 2 is a plan view of a D/A converter using a CCD in accordance with a preferred embodiment of the present invention.
Figure 3:
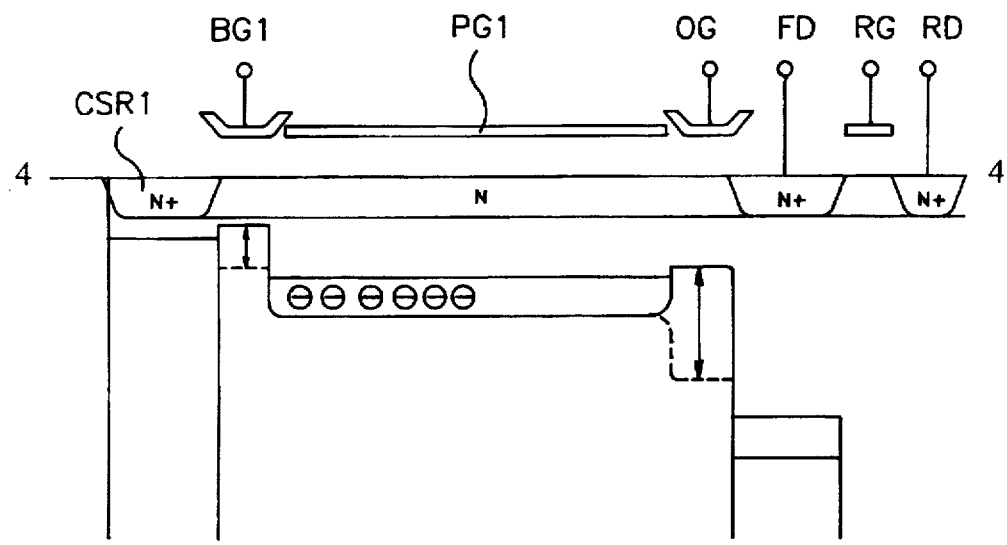
FIG. 3 shows the vertical structure of the D/A converter according to the present invention.

Referring to FIGS. 2 and 3, a D/A converter of the present invention utilizes a CCD, shown in FIG. 2, that includes charge source regions CSR1–CSRn which correspond to bits of digital data and are formed as high-concentration N-type impurity areas on predetermined portions of a semiconductor substrate. The semiconductor substrate has a P-type well, and barrier gates BG1–BGn are formed on one side of the respective charge source regions CSR1–CSRn. Corresponding bit signals of digital data are input to the barrier gates for converting the voltages representing the digital data into analog data. Poly-gates PG1–PGn are formed on the charge source regions CSR1–CSRn beside the barrier gates BG1–BGn. The poly-gates cover an area corresponding to the bit ciphers of the digital data. A common output gate OG is formed beside all of the poly-gates PG1–PGn. A floating diffusion area FD collects charges accumulated in respective poly-gates PG1–PGn and senses the overall amount of charges. A reset gate RG and a reset drain area RD are formed or floating diffusion area FD to discharge the floating diffusion area after the overall charge that corresponds to the converted analog data is sensed.

The sizes of the poly-gates PG1–PGn vary with bit ciphers. For an n-bit converter, poly-gate PG1 of the LSB has an area of $2^0$ and poly-gate PGn of the MSB has an area of $2^{n-1}$. FIG. 2 shows a four-bit D/A converter.

The operation of the D/A converter using CCD 10 will be explained below.

If a digital signal of 1010 is input, logic 1 signals are applied to the first and third barrier gates BG1 and BG3 and logic 0 signals are applied to the second and fourth barrier gates BG2 and BG4. The potentials of the channel areas of the first and third barrier gates BG1 and BG3 to which the logic 1 signals are applied are lowered so that the charges placed in the charge source regions CSR1 and CSR3 are input to potential pockets of poly-gates PG1 and PG3. The potentials of the channel areas of the second and fourth barrier gates BG2 and BG4 to which the logic 0 signals are applied are not lowered so that the charges of the charge source regions CSR2 and CSR4 are not input to the potential pockets of poly-gates PG2 and PG4. When logic 1 signals are applied, the amounts of the charges input to the potential pockets of the poly-gates vary because the areas of the poly-gates are different.

In this example, the amount of charge input to the potential pocket of the first poly-gate PG1 is 8, whereas the amount of charge input to the third poly-gate PG3 is 2.

When the migrations of charges are completed according the data values of the respective bit signals, a HIGH pulse is applied to the output gate OG so that the charges of the potential pockets of the poly-gates move to the floating diffusion area FD.

The floating diffusion area FD senses the amount of migrated charges. After the FD senses the charge amounts, the charges are shifted to reset drain RD and discharged when a HIGH signal is applied to the reset gate RG. The overall amount of charges input to floating diffusion area FD is 8+2=10. As a result, four bits of the digital signal 0101 are converted into analog data representing the number ten. Digital signal is thereby converted into analog data.

Figure 4:
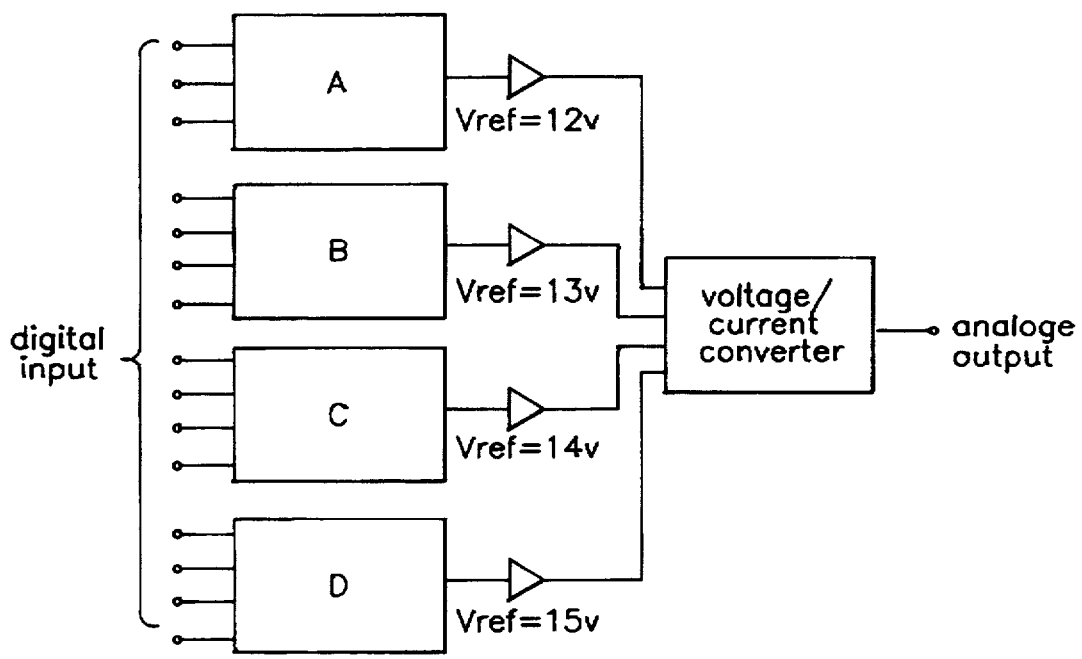
FIG. 4 is a circuit diagram of a 15-bit D/A converter structured in accordance with the present invention.
Figure 5:
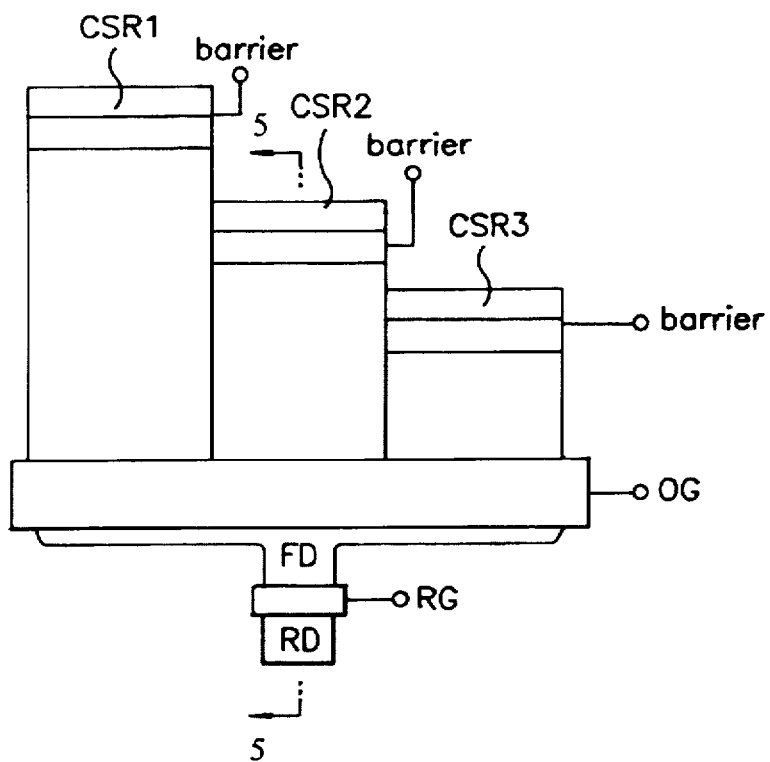
FIG. 5 is a plan view of group A of FIG. 4.
Figure 6:
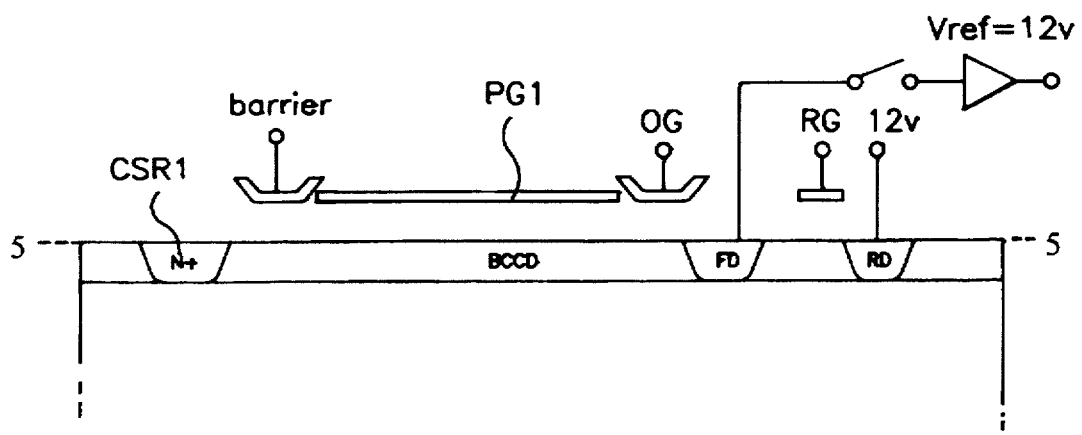
FIG. 6 is a sectional view of FIG. 5 cut along line B-B'.

Referring to FIGS. 4, 5, and 6, a 15-bit D/A converter is not constructed with fifteen charge source regions CSR, barrier gates BG1–BGn and poly-gates PG1–PGn, as have been described in FIG. 2. Rather, the charge source regions, barrier gates and poly-gates of three or four CCD groups are combined to provide the 15-bit D/A converter.

According to the input levels of the digital bit signals, the CCDs are divided into CCD groups A, B, C and D. Each CCD group has the configuration 10 shown in FIG. 2, and the poly-gates have the same size as in FIG. 2. FIG. 5 represents CCD group A configured to receive three digital bit signals. FIG. 6 is a sectional view of FIG. 5 cut along line B-B'.

The analog signals output from the respective CCD groups are amplified and output according to different reference values. The voltage output values are summed and converted into a current signal by a voltage/current converter and output as the analog data.

In FIGS. 4, 5 and 6, the reference voltages for the respective groups are 12, 13, 14, and 15V.

As described above, the D/A converter using CCD 10 of the present invention is advantageous in that it has a simplified structure and operation and is reduced in size.

Accordingly, the production cost is lower and the performance is better.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A digital-to-analog (D/A) converter using a charge coupled device (CCD) for converting digital data to analog data, the CCD comprising:

a semiconductor substrate having a first-conductivity type well;

a plurality of high-concentration charge source regions, positioned on predetermined portions of said semiconductor substrate, each corresponding to a single bit of the digital data;

a plurality of barrier gates, each formed on a respective one of a plurality of charge source regions adjacent to said high concentration charge source regions, for receiving inputs of corresponding bit signals of the digital data;

a plurality of poly-gates, each formed on a respective one of said charge source regions and having an area corresponding to the bit signals of the digital data;

a common output gate formed adjacent to a respective one of said plurality of poly-gates;

a high-concentration, second-conductivity type, floating diffusion area, for collecting charges accumulated in said poly-gates and sensing an overall amount of the charges; and a reset gate and reset drain area, formed on said floating diffusion area, for discharging the accumulated charges after said floating diffusion area senses said overall amount of the charges that corresponds to the analog data wherein, when the number of bit signals is greater than a predetermined number, the charge source regions, barrier gates and poly-gates are provided as one CCD block, and several CCD blocks are logically combined to form a multi-bit D/A converter.

2. The CCD as claimed in claim 1, wherein, in case of n bit signals, said poly-gates have areas differing by factors of $2^{n-1}$.

* * * * *